(12) United States Patent
Chang et al.

(10) Patent No.: US 8,193,632 B2
(45) Date of Patent: Jun. 5, 2012

(54) THREE-DIMENSIONAL CONDUCTING STRUCTURE AND METHOD OF FABRICATING THE SAME

(75) Inventors: Hsiang-Hung Chang, Hsinchu County (TW); Shu-Ming Chang, Taipei County (TW); Tzu-Ying Kuo, Taipei (TW); Yuan-Chang Lee, Taoyuan County (TW)

(73) Assignee: Industrial Technology Research Institute, Hsinchu (TW)

( * ) Notice: Subject to any disclaimer, the term of this patent is extended or adjusted under 35 U.S.C. 154(b) by 451 days.

(21) Appl. No.: 12/500,780

(22) Filed: Jul. 10, 2009

(65) Prior Publication Data

US 2010/0032830 A1 Feb. 11, 2010

(30) Foreign Application Priority Data

Aug. 6, 2008 (TW) ................ 97129949 A

(51) Int. Cl.
*H01L 23/04* (2006.01)
(52) U.S. Cl. ................ 257/698; 257/E23.011
(58) Field of Classification Search .......... 257/621, 257/698, 700, 737, 774, E23.011, E23.169
See application file for complete search history.

(56) References Cited

U.S. PATENT DOCUMENTS

| 4,777,718 | A | * | 10/1988 | Henderson et al. ............ 29/620 |
| 5,051,802 | A | | 9/1991 | Prost |
| 6,521,881 | B2 | | 2/2003 | Tu et al. |
| 6,791,076 | B2 | | 9/2004 | Webster |
| 7,045,888 | B2 | | 5/2006 | Tsai |
| 7,061,106 | B2 | | 6/2006 | Yang |

* cited by examiner

*Primary Examiner* — Quoc Hoang
(74) *Attorney, Agent, or Firm* — Thomas|Kayden

(57) ABSTRACT

The three-dimensional conducting structure comprises a substrate, a first redistributed conductor, a second redistributed conductor and an insulator. The substrate has an active surface, a passive surface opposite to the active one, a pad on the active surface and a through hole. The first redistributed conductor comprises a projecting portion and a receiving portion. The projecting portion is projected from the active surface and electrically connected to the pad. The receiving portion is outside the active surface and in contact with the projecting portion, both of which constitute a recess communicating with the through hole. The second redistributed conductor is positioned within the through hole and the recess, in contact with the receiving portion, and extended toward the passive surface along the through hole. The insulator is filled between the second redistributed conductor and the substrate and between the second redistributed conductor and the projecting portion.

16 Claims, 6 Drawing Sheets

THREE-DIMENSIONAL CONDUCTING STRUCTURE AND METHOD OF FABRICATING THE SAME

This application claims the benefit of Taiwan application Serial No. 97129949, filed Aug. 6, 2008, the subject matter of which is incorporated herein by reference.

BACKGROUND OF THE INVENTION

1. Field of the Invention

The disclosure relates in general to a conducting structure and method of fabricating the same, and more particularly to a three-dimensional conducting structure and method of fabricating the same.

2. Description of the Related Art

Generally speaking, system in package (SiP) includes the following technologies such as multi-chip module (MCM) technology, multi-hip package (MCP) technology, stack die technology, package on package (PoP) technology, package in package (PiP) and embedded substrate technology which embed the active/passive elements in the substrate. In terms of the appearance of the package structure, MCM is a two-dimensional package, and MCP, stack die, PoP, PiP are three-dimensional three-dimensional packages. The three-dimensional package which meets the requirements of miniaturization and high efficiency has become more popular in recent years.

On the part of interconnection technology, most of conventional two-dimensional or three-dimensional packages adopt wire bonding and a few adopt flip chip technology or a mixture of wire bonding and flip chip technology. Let a stack die be taken for example. The top chip communicates with other chips by way of wire bonding technology. As the number of stacked chips increases, the upper the chip, the longer the wire, and the overall efficiency of the package system is deteriorated. Also, in order to create a space for wire bonding, a divider is inserted between chips, further increasing the volume of the package.

In recent years, the through silicon via (TSV) technology, a new interconnection technology, is provided. Referring to FIGS. 1A~1F, the process of a method of fabricating a TSV conductive structure is shown. Firstly, as indicated in FIG. 1A, a chip 10 is provided, and the front surface 10a of the chip has a thickness-enhanced solder pad 12. Then, as indicated in FIG. 1B, a first laser drilling process is applied by way of drilling a opening 14 from the back surface 10b of the chip until reaching the surface of the pad 12. As the chip is drilled from the back surface 10b, the problem of mal-alignment may easily occur. On the other hand, as the laser power is unstable and the selective ratio between the silicon (the chip material) and the metal (the pad material) is not high enough, the laser light may easily penetrate through the pad. Despite this problem can be resolved by thickening the pad 12, additional cost and time will be needed.

Referring to FIG. 1C, the opening 14 is filled with an insulator 16. Then, a second laser drilling process is applied as indicated in FIG. 1D, wherein an via 17 is formed by drilling within the insulator 16 until the surface of the pad 12 is reached. After that, as indicated in FIG. 1E, the via 17 is filled with a conducive material 18. Lastly, as indicated in FIG. 1F, the chip 10 and another chip 20 are bonded together, and the pad 12 of the chip 10 is electrically connected with the pad 22 of another chip 20 through the conductive material 18.

However, hole enlargement may easily occur during the second laser drilling process of forming the via 17 and result in current leakage. When laser drilling reaches the pad 12, the metallic material (that is, the pad 12) will reflect or deflect the laser light, and the insulator 16 neighboring the pad 12 will be burnt by the laser light. Consequently, the terminal end of the via 17 will become larger and the chip 10 may even be exposed. When the via 17 is re-filled with the conductive material 18, the conductive material 18 will contact the chip 10, making the conductive material 18 and the chip 10, which are supposed to be insulated, are electrically connected with each other and result in the problem of current leakage.

SUMMARY OF THE INVENTION

The invention is directed to a three-dimensional conducting structure and method of fabricating the same.

According to a first aspect of the present disclosure, a three-dimensional conducting structure applied to a package is provided. The three-dimensional conducting structure comprises a substrate, a first redistributed conductor, a second redistributed conductor and an insulator. The substrate has an active surface, a passive surface opposite to the active one, a pad on the active surface and a through hole. The first redistributed conductor comprises a projecting portion and a receiving portion. The projecting portion is projected from the active surface of the substrate and electrically connected to the pad. The receiving portion is outside the active surface and in contact with the projecting portion, wherein the projecting portion and the receiving portion constitute a recess, which communicates with the through hole. The second redistributed conductor is positioned within the through hole and the recess, in contact with the receiving portion, and extended toward the passive surface along the through hole. The insulator is filled between the second redistributed conductor and the substrate and between the second redistributed conductor and the projecting portion.

According to a second aspect of the present disclosure, a method of fabricating a three-dimensional conducting structure applied to a package is provided. The method comprises the following steps: (a) A substrate is provided, wherein the substrate has an active surface, a passive surface opposite to the active one, and a pad on the active surface. (b) A through hole is formed by drilling the substrate from the active surface to the passive surface. (c) A first redistributed conductor is formed on the active surface, wherein the first redistributed conductor is connected to the pad and projected outward from the active surface so as to form a recess which communicates with the through hole. (d) The through hole and the recess are filled with an insulator. (e) A hole is formed within the insulator by applying laser drilling along the through hole and the recess, wherein the terminal of the hole exposes the first redistributed conductor. (f) The hole is filled with a conductive material so as to form a second redistributed conductor which contacts the first redistributed conductor.

The disclosure will become apparent from the following detailed description of the preferred but non-limiting embodiments. The following description is made with reference to the accompanying drawings.

DETAILED DESCRIPTION OF THE INVENTION

The disclosure mainly provides a three-dimensional conducting structure and a method of fabricating the same. The three-dimensional conducting structure comprises a substrate, a first redistributed conductor, a second redistributed conductor and an insulator. The substrate has an active surface, a passive surface opposite to the active one, a pad on the active surface and a through hole. The first redistributed conductor comprises a projecting portion and a receiving portion. The projecting portion is projected from the active surface of the substrate and electrically connected to the pad. The receiving portion is outside the active surface and in contact with the projecting portion, wherein the projecting portion and the receiving portion constitute a recess, which communicates with the through hole. The second redistributed conductor is positioned within the through hole and the recess, in contact with the receiving portion, and extended toward the passive surface along the through hole. The insulator is filled between the second redistributed conductor and the substrate and between the second redistributed conductor and the projecting portion.

The conducting structure of the disclosure can pass through the substrate vertically and extend horizontally so as to achieve three-dimensional wiring within a package structure where several elements need to be interconnected. The conducting structure of the disclosure reduces package volume and shortens wire length, making transmission rate faster, noise smaller, and efficiency better. The fabricating process and structural characteristics of the three-dimensional conducting structure of disclosure as well as the disposition of the three-dimensional conducting structure in the package structure are disclosed in the following embodiments with accompanied drawings. Any who is skilled in the technology of the disclosure will understand that the drawings and descriptions are for elaboration only not for limiting the scope of protection of the disclosure.

First Embodiment

Referring to FIGS. 2A~2J, the process schematically illustrating a method of fabricating a package having a three-dimensional conducting structure according to a first embodiment of the disclosure is shown. The method of fabricating a package having a three-dimensional conducting structure of the present embodiment of the disclosure comprises the following steps. Firstly, referring to FIG. 2A, a first substrate 110 is provided, and the first substrate 110 has an active surface 112, a passive surface 114 opposite to the active one, and a pad 116 on the active surface 112. The first substrate 110 is preferably a CMOS image sensor (CIS) chip, which receives an image or a light through the active surface 112.

Figure 1A:
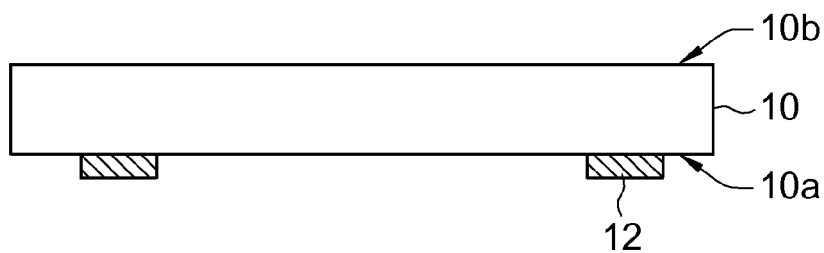
FIGS. 1A~1F show the process of a method of fabricating a TSV conductive structure.
Figure 1B:
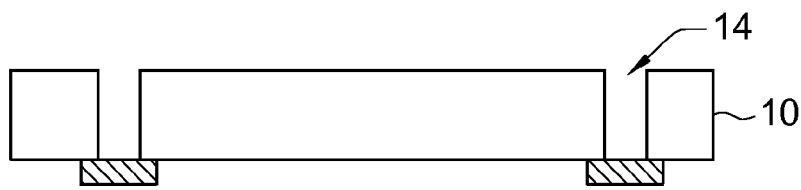
Figure 1C:
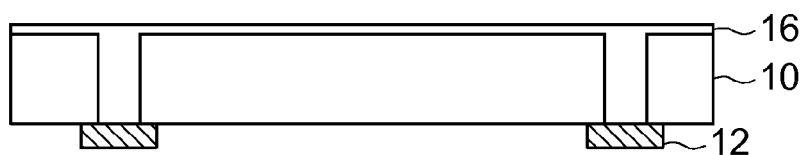
Figure 1D:
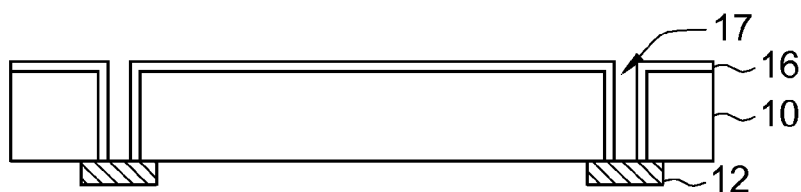
Figure 1E:
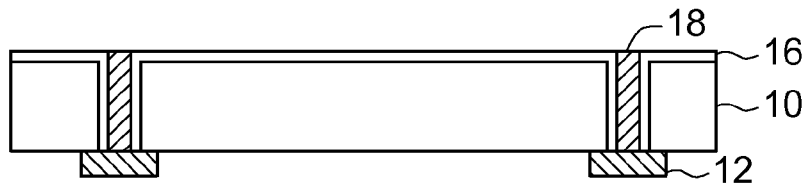
Figure 1F:
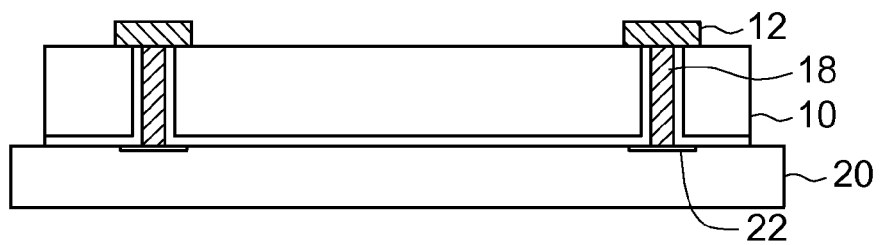
Figure 2A:
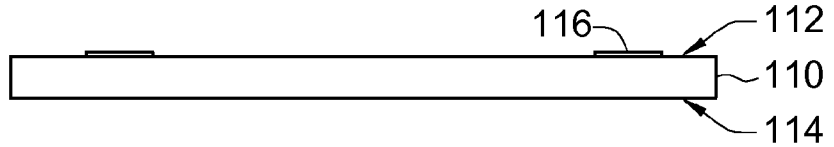
FIGS. 2A~2J show the process of a method of fabricating a package having a three-dimensional conducting structure according to a first embodiment of the disclosure.
Figure 2B:
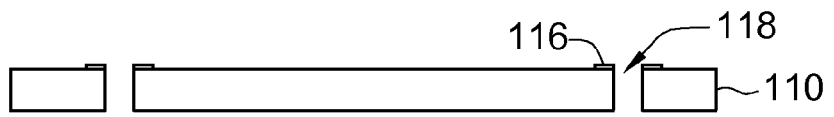

Afterwards, a through hole 118 is formed by drilling the first substrate 110 from the active surface 112 to the passive surface 114. The through hole 118 can be formed at any position of the first substrate 110. For example, the through hole 118 can pass through the pad 116 directly as indicated in FIG. 2B or only pass through the part of the substrate with lower intensity of wiring as indicated in FIG. 4B of the second embodiment of the disclosure. As the position of the pad and the metallic wire pattern can be easily seen on the active surface, the through hole 118 can be precisely formed at predetermined position by way of drilling from the active surface no matter the through hole is formed by passing through the pad 116 or formed at any position of the substrate. In other words, by way of drilling the first substrate 110 from the active surface 112, the present embodiment of the disclosure effectively resolves the conventional problem of mal-alignment.

Figure 2C:
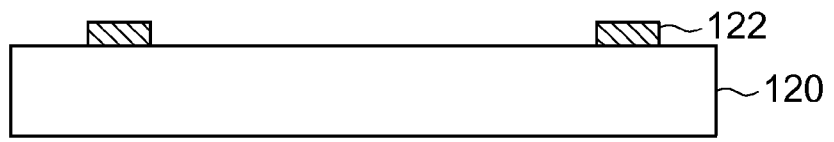

Then, a first redistributed conductor (as numerical label 130 shown in FIG. 2G) is formed on the active surface 112 of the first substrate 110. There are many methods of fabricating the first redistributed conductor, and one of them is provided in the present embodiment of the disclosure with accompanied drawings FIGS. 2C~2G. Firstly, as indicated in FIG. 2C, a second substrate 120 is provided, and at least one pad 122 is formed on the second substrate 120. The second substrate 120 is preferably a transparent substrate, such as a glass substrate, such that the light can penetrate through the second substrate 120 and enter the substrate underneath. Normally, a metallic layer is formed on the second substrate 120, and a part of the metallic layer is removed to form a patterned metal layer such as the pad 122 on the second substrate 120. After that, referring to FIG. 2D, an insulating layer 124 covers the pad 122 and the second substrate 120, and the insulating layer 124 preferably is an ajinomoto build-up film (ABF) insulating film or an anisotropic conductive film (ACF) film. Then, referring to FIG. 2E, a part of the insulating layer 124 is removed so as to form an indent 126 on the insulating layer 124, and the indent 126 exposes the pad 122. On the other hand, the insulating layer 124 preferably has an opening 127 corresponding to the active surface 112 of the first substrate 110. Thus, the second substrate assembly 120a whose surface is covered by the insulating layer 124 is completed, and the insulating layer 124 has an indent 126 which exposes the pad 122. Then, referring to FIG. 2F, a conductive layer 128 is formed on the pad 122, the inner-wall of the indent 126 and a part of the insulating layer 124 by way of sputtering, chemical vapor deposition (CVD), printing, etc. According to the position of distribution, the conductive layer 128 is further divided into a projecting portion 128a and a receiving portion 128b. The projecting portion 128a comprises a conductive layer 128 positioned on the insulating layer 124 and the inner-wall of the indent 126. The receiving portion 128b comprises a conductive layer 128 positioned on the pad 122. The receiving portion 128b is connected to the projecting portion 128a. The projecting portion 128a and the receiving portion 128b constitute a recess 136. The projecting portion 128a and the receiving portion 128b preferably are integrally formed in one piece. In the present embodiment of the disclosure, the conductive layer 128 and the pad 122 preferably constitute the first redistributed conductor 130.

It is noted that the pad 122 on the second substrate 120 can be omitted. When the pad 122 is omitted, the conductive layer 128 still can be formed within the second substrate assembly 120a along the indent 126. Thus, in other preferred embodiments, the conductive layer 128 independently constitutes the first redistributed conductor 130.

In the present embodiment of the disclosure, the process of forming the second substrate assembly 120a adopts yellow light etching steps twice for etching the pad and the insulating layer opening respectively. When the light passes through the second substrate 120 (such as a glass) and the insulating layer opening and enters the first substrate 110 (such as a CIS chip), the image received by the CIS chip is clear without any errors, and the received image is free of noise or dirt which will occur if the glass surface is scratched since the yellow light etching does not damage glass surface.

Figure 2D:
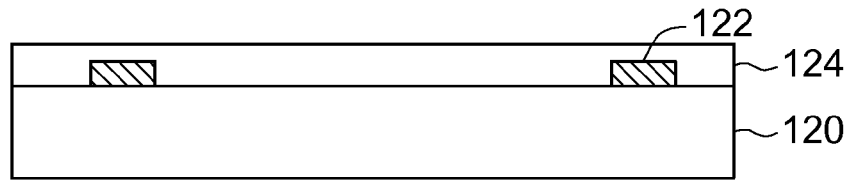
Figure 2E:
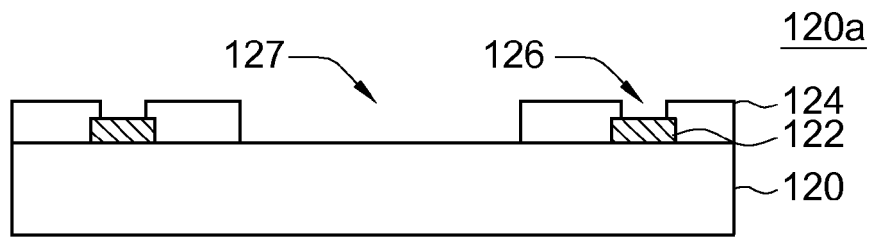
Figure 2F:
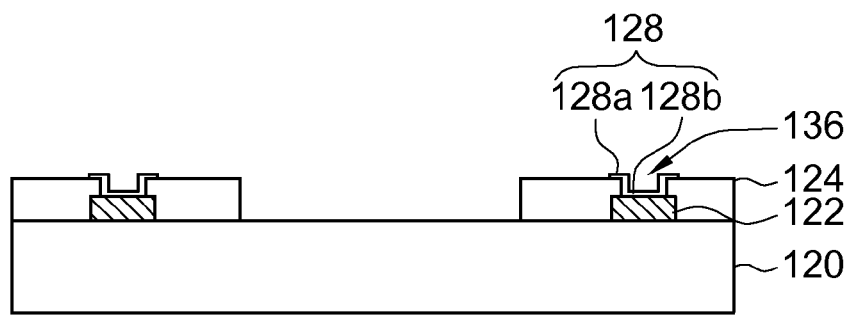
Figure 2G:
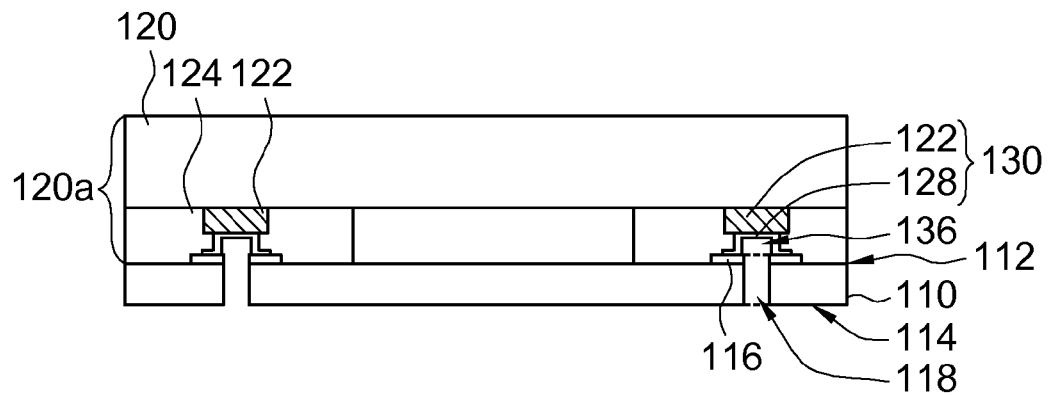

Then, referring to FIG. 2G, the second substrate assembly 120a is turned over to be correspondingly bonded to the active surface 112 of the first substrate 110. The conductive layer 128 positioned on the insulating layer 124 is connected to the pad 116, and the conductive layer 128 positioned on the pad 122 and the inner-wall of the indent faces the through hole 118 so as to form a first redistributed conductor 130 on the active surface 112 of the first substrate 110. The first redistributed conductor 130 is connected to the pad 116 and is projected outward from the active surface 112 so as to form a recess 136 which communicates with the through hole 118 as indicated in FIG. 2G.

Figure 2H:
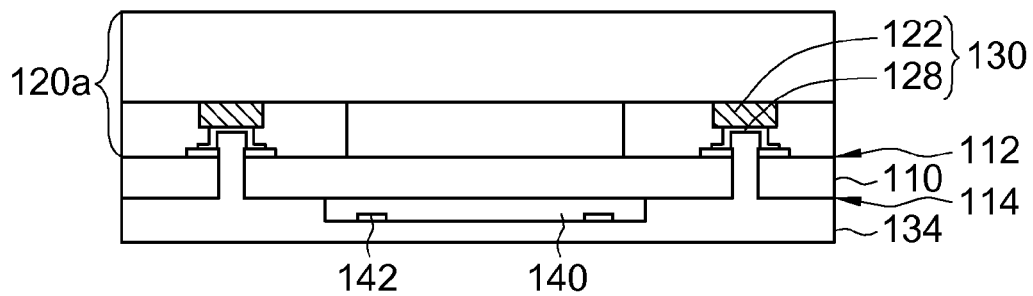

Then, the through hole 118 and the recess 136 are filled with an insulator 134 as indicated in FIG. 2H. In a preferred embodiment, the third substrate 140 is positioned on the passive surface 114 of the first substrate 110, and the insulator 134 also covers the third substrate 140 and the passive surface 114 of the first substrate 110. The third substrate 140 also has an active surface and a passive surface opposite to the active one. The active surface of the third substrate 140 comprises a pad 142, and the pad 142 preferably is apart from the passive surface 114 of the first substrate 110.

Figure 2I:
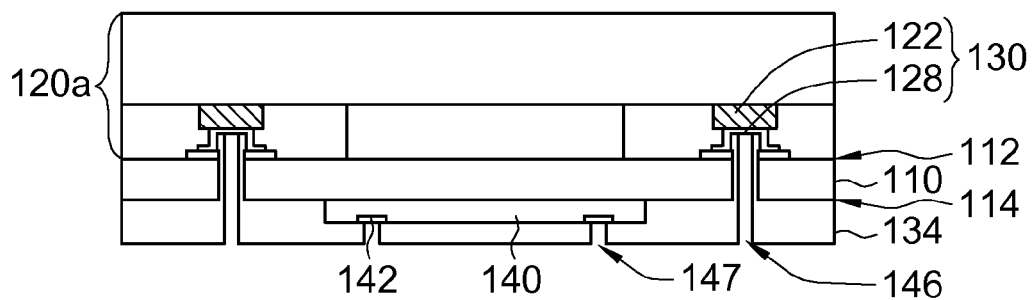

After that, a hole 146 is formed within the insulator 134 by perforating the insulator 134 from the passive surface 114 towards the active surface 112 along the through hole 118 and the recess 136. The terminal of the hole 146 exposes the conductive layer 128 of the first redistributed conductor 130 as indicated in FIG. 2I. The drilling method is preferably performed by laser drilling technology. As laser has a high selective ratio between the insulating material and the metallic material, it is easy to control the laser not to etch the conductive layer 128 after the laser has finished etching the insulator 134. Thus, the conventional problem that the conductive layer is penetrated can be avoided. In a preferred embodiment, an opening 147 can be formed by removing the insulator 134 in the same manner or different manners so as to expose the pad 142 on the third substrate 140.

Figure 2J:
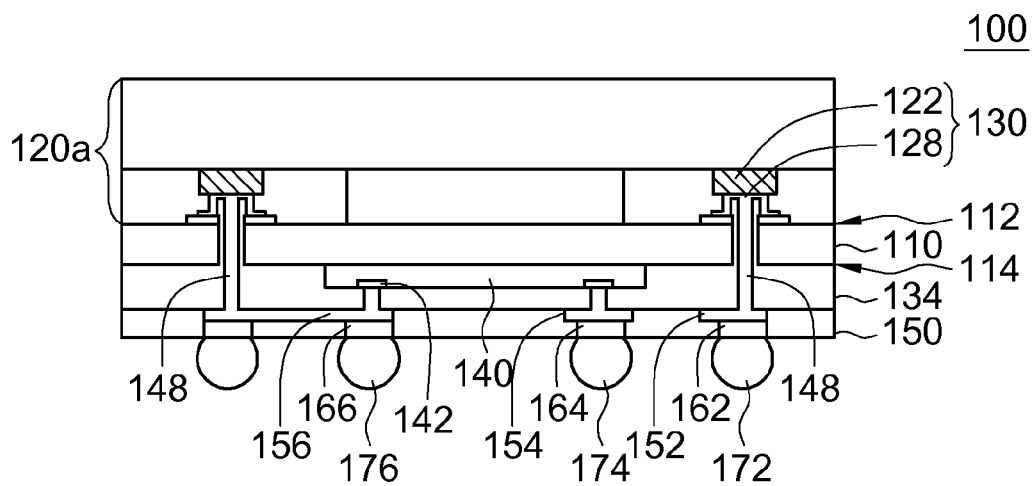

Then, the hole 146 is filled with a conductive material so as to form a second redistributed conductor 148 which contacts with the first redistributed conductor 130 as indicated in FIG. 2J.

The structural characteristics of the three-dimensional conducting structure which is fabricated according to the above method are disclosed below. Referring to FIG. 2G, the three-dimensional conducting structure of the present embodiment of the disclosure comprises a first substrate 110, a first redistributed conductor 130, a second redistributed conductor 148 and an insulator 134. The first substrate 110 has a pad 116 and a through hole 118, and the pad 116 is positioned on the active surface 112. In the present embodiment of the disclosure, the through hole 118 preferably passes through the pad 116.

The first redistributed conductor 130 comprises a projecting portion 128a and a receiving portion 128b. The projecting portion 128a and the receiving portion 128b preferably are integrally formed in one piece. The projecting portion 128a (that is, the part of the conductive layer 128 positioned on the inner-wall of indent 126) is projected from the active surface 112 of the first substrate 110 and electrically connected to the pad 116. The projecting portion 128a of the present embodiment of the disclosure preferably is positioned on the pad 116. The receiving portion 128b (that is, the part of the conductive layer 128 positioned on the surface of the pad 122) is outside the active surface 112, and in contact with the projecting portion 128a. The projecting portion 128a and the receiving portion 128b constitute a recess 136, which communicates with the through hole 118. In the present embodiment of the disclosure, the first redistributed conductor 130 preferably further comprises a pad 122 positioned on the second substrate 120 and is connected to the receiving portion 128b.

The second redistributed conductor 148 is positioned within the through hole 118 and the recess 136, in contact with the receiving portion 128b, and extended toward the passive surface 114 from the receiving portion 128b along the through hole 118. The insulator 134 is filled between the second redistributed conductor 148 and the first substrate 110 and between the second redistributed conductor 148 and the projecting portion 128a.

The pad 116 on the first substrate 110 is connected to the first redistributed conductor 130 (which comprises a pad and a conductive layer 128 of the second substrate 120), and the first redistributed conductor 130 is connected to the second redistributed conductor 148, such that the electrical signal of the first substrate 110 can be transmitted to other elements through the first redistributed conductor 130 and the second redistributed conductor 148. Also, the three-dimensional conducting structure of the present embodiment of the disclosure avoids the problem of current leakage. In greater details, conventionally when laser is used in drilling and reaches the conductive layer 128, the conductive layer 128 will reflect or deflect the laser light, and the insulator 134 which neighbors the conductive layer 128 will be burnt by the laser light as well. Thus, the terminal of the hole 146 will have a larger aperture or even expose the surrounding material such as the substrate. When the hole 146 with larger aperture is re-filled with a conductive material, the conductive material will contact the surrounding material, and the conductive material and the substrate which are supposed to be insulated become electrically connected and result in current leakage. However, according to the three-dimensional conducting structure of the present embodiment of the disclosure, the conductive layer 128 surrounds the terminal of the hole 146. Despite hole enlargement occurs during laser drilling, the conductive material (that is, the second redistributed conductor 148) still contacts the conductive layer 128 and will not transmit the current to the substrate. Thus, the three-dimensional conducting structure of the present embodiment of the disclosure resolves the problem of current leakage which is hard to be resolved in the conventional through silicon via (TSV) conducting structure.

In a preferred embodiment, the opening 147 is filled with the conductive material, a patterned conductive layer 152/154/156 is formed on the surface of the insulator 134, the insulating layer 150 covers the first substrate 110 and the third substrate 140, the insulating layer 150 is etched and then filled with the conductive material to form the pad 162/164/166, and the solder balls 172/174/176 are planted on the pad 162/164/166. Lastly, the package 100 as indicated in FIG. 2J is completed.

The package 100 of the present embodiment of the disclosure uses a three-dimensional conducting structure to transmit electrical signals between the substrates or between the substrate and external elements. For example, the first substrate 110 can transmit electrical signal with external elements through the path constituted by the pad 116, the first redistributed conductor 130, the second redistributed conductor 148, the conductive layer 152, the pad 162 and the solder ball 172. The first substrate 110 can also transmit electrical signal to a third substrate 140 through the path constituted by the pad 116, the first redistributed conductor 130, the second redistributed conductor 148, the conductive layer 156, the pad 166 and the solder ball 176, such as an image received by the first substrate 110 being transmitted to a third substrate for image processing.

As is disclosed in the present embodiment of the disclosure, the second substrate 120 preferably is a glass substrate, the first substrate 110 is preferably a CMOS image sensor (CIS) chip which receives an image or a light from the active surface 112 through a glass substrate, and the third substrate 140 is preferably a digital signal processor (DSP) for processing the image received from the first substrate 110 (such as a CIS chip) and then transmitting the processed image. However, anyone who is skilled in the technology of the disclosure will understand that the three-dimensional conducting structure and the method of fabricating the same disclosed in the disclosure are not limited thereto and can also be applied to micro-electro-mechanical systems (MEMS) or other package structures or technologies.

Figure 3A:
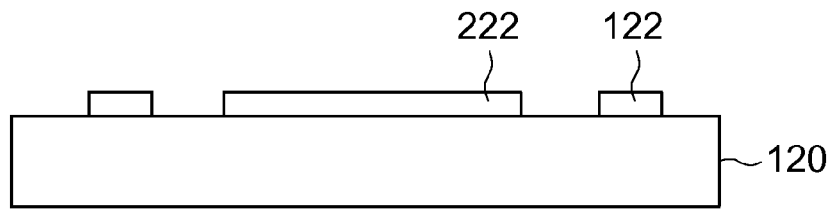
FIGS. 3A~3E shows the process of another method of forming a second substrate assembly according to a first embodiment of the disclosure.
Figure 3B:
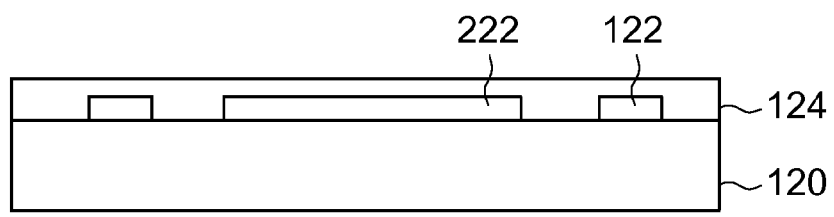
Figure 3C:
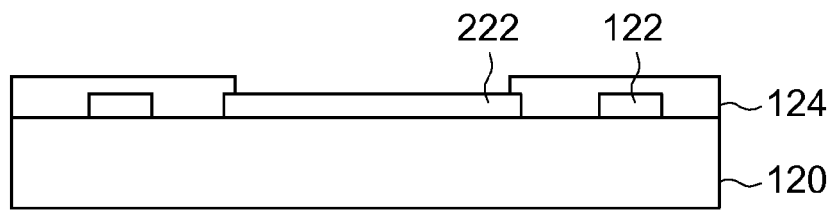
Figure 3D:
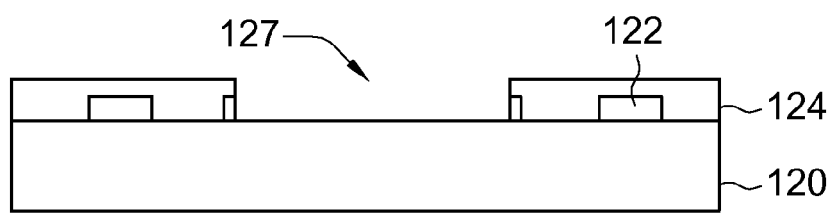
Figure 3E:
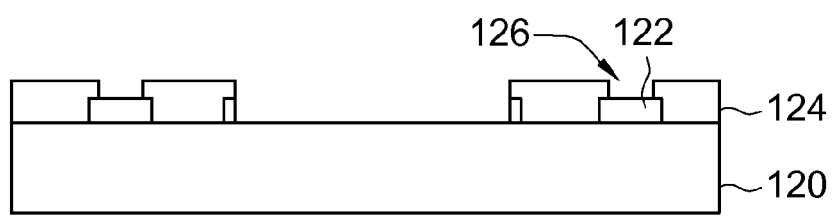

In the present embodiment of the disclosure, the step of forming the second substrate assembly is disclosed in FIGS. 2C~2E. However, the disclosure is not limited thereto. Referring to FIGS. 3A~3E, the process illustrating another method of forming a second substrate assembly according to a first preferred embodiment of the disclosure is shown. Firstly, as indicated in FIG. 3A, a second substrate 120 is provided, and a patterned metal layer is formed on the second substrate 120. The patterned metal layer comprises a protection layer 222 and at least one pad 122. The thickness of the patterned metal layer preferably is about 1 μm. After that, referring to FIG. 3B, an insulating layer 124 covers the protection layer 222, the pad 122 and the second substrate 120, and the thickness of the insulating layer 124 preferably is about 40 μm. Then, referring to FIG. 3C, a part of the insulating layer 124 is removed so as to expose the protection layer 222. Preferably, the insulating layer is removed by laser. As laser would also etch the second substrate 120, the surface of the second substrate 120 would easily be scratched in the absence of the protection layer 222 during the laser step. Moreover, the laser has a high selective ratio between the insulating material and the metallic material (the pad 122), so the protection layer 222 can effectively prevent the second substrate 120 from being damaged by the laser. Then, referring to FIG. 3D, the exposed protection layer 222 is etched by a yellow light process to form an opening 127 on the insulating layer. The opening corresponds to the light sensing area on the active surface 112 of the first substrate 110, such that the light can pass through the second substrate 120 and the opening 127 and enters the substrate underneath. Lastly, referring to FIG. 3E, another part of the insulating layer 124 is removed so as to form an indent 126 on the insulating layer 124, and the indent 126 exposes the pad 122. In the present step, preferably the insulator is removed according to laser drilling technology. According to the method of fabricating the present embodiment of the disclosure, the second substrate assembly is completed through two laser drilling processes and one yellow light process. It results in not only the even surface of the second substrate but also low manufacturing cost. As laser has a high selective ratio between the insulating material and the metallic material, it is easy to control the laser not to etch the metallic material after the laser has finished etching the insulator. Thus, the conventional problem that the conductive layer is penetrated can be avoided.

Second Embodiment

The present embodiment of the disclosure differs with the first embodiment in the position of the through hole, and the structure of the first redistributed conductor the method for fabricating thereof. As for other similar elements and procedures, the same designations are used and are not repeated here.

Figure 4A:
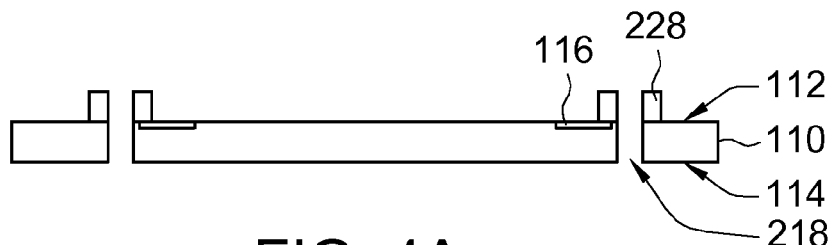
FIGS. 4A~4D show the process of a method of fabricating a package having a three-dimensional conducting structure according to a second embodiment of the disclosure.
Figure 4B:
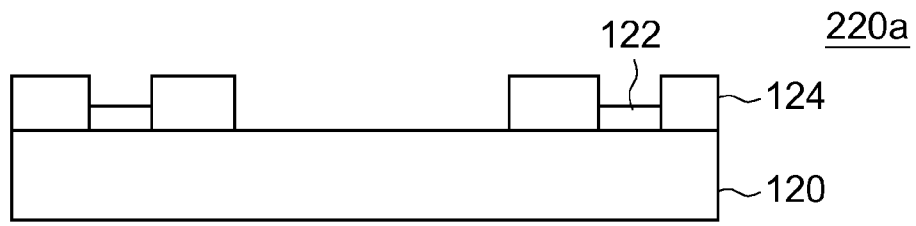

Referring to FIGS. 4A~4D, the process of a method of fabricating a package having a three-dimensional conducting structure according to a second embodiment of the disclosure is shown. Referring to FIG. 4A, the first substrate 110 has a through hole 218, and a pad 116 on the active surface 112. Then, a first redistributed conductor is formed on the active surface 112 of the first substrate 110. The detailed steps are disclosed below.

Firstly, as indicated in FIG. 4A, a conductive bump 228 is formed on the active surface 112 of the first substrate 110 by way of electroplating or printing. The conductive bump 228 is projected outward from the active surface 112 of the first substrate 110 and is electrically connected to the pad 116 so as to the projecting portion of the first redistributed conductor. The conductive bump 228 of the present embodiment of the disclosure preferably is positioned on the pad 116 and extended to the active surface 112 around the through hole 218. Compared with the first embodiment, the through hole 218 of the present embodiment of the disclosure is positioned apart from the pad 116, such as at the edge of the first substrate 110 or at the part of the first substrate 110 with lower intensity of wiring, but the pad 116 can be redistrubitued by the conductive bump 228. It increases the freedom in the layout and distribution of the first substrate.

Then, as indicated in FIG. 4B, a second substrate assembly 220a comprising a second substrate 120, a pad 122 and an insulating layer 124 is provided. The pad 122 and the insulating layer 124 are neighbored and positioned on the second substrate 120.

Figure 4C:
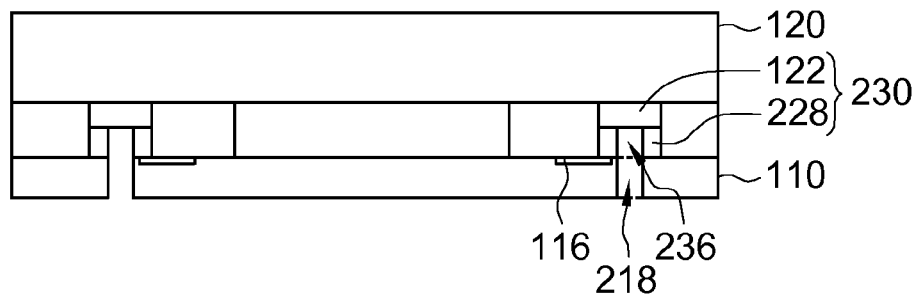

After that, as indicated in FIG. 4C, the second substrate assembly 220a is turned over, the pad 122 of the second substrate assembly 220a is soldered onto the conductive bump 228 of the first substrate 110, and the second substrate assembly 220a is bonded onto the active surface 112 of the first substrate 110 so as to form a first redistributed conductor 230 on the active surface 112 of the first substrate 110.

The first redistributed conductor 230 of the present embodiment of the disclosure is constituted by the pad 122 of the second substrate 120 and the conductive bump 228 of the first substrate 110. In terms of structure, the first redistributed conductor 230 comprises a projecting portion (that is, the conductive bump 228) and a receiving portion (that is, the pad 122). The projecting portion (that is, the conductive bump 228) is projected from the active surface 112 of the first substrate 110 and is electrically connected to the pad 116. The receiving portion (that is, the pad 122) is positioned outside the active surface 112 and in contact with the projecting portion (that is, the conductive bump 228). The projecting portion (that is, the conductive bump 228) and the receiving portion (that is, the pad 122) constitute a recess 236, which communicates with the through hole 218.

Figure 4D:
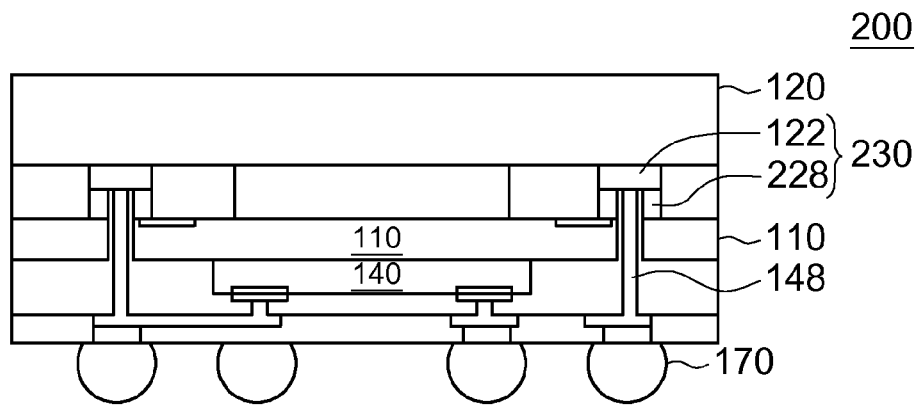

Lastly, the insulator 134, the second redistributed conductor 148, the third substrate 140, the solder ball 170 are sequentially formed so as to complete the package 200 as indicated in FIG. 4D. The second redistributed conductor 148 is positioned within the through hole 218 and the recess 236, in contact with the receiving portion (that is, the pad 122), and is extended toward the passive surface 114 from the receiving portion (that is, the pad 122) along the through hole 218.

The first redistributed conductor 230 of the present embodiment of the disclosure and the first redistributed conductor 130 of the first embodiment are formed in different ways. The first redistributed conductor 230 of the present embodiment of the disclosure, which is constituted by the conductive bump 228 and the pad 122, also has a recess, and when hole enlargement occurs during the process of drilling a hole, the conductive material (that is, the second redistributed conductor 148) still contacts the first redistributed conductor 230 and will not transmit the electrical current to the substrate. Thus, the three-dimensional conducting structure of the present embodiment of the disclosure is capable of resolving the conventional problem of current leakage when through silicon via (TSV) conducting structure is used.

The projecting portion (that is, the conductive bump 228) of the first redistributed conductor 230 of the present embodiment of the disclosure is preferably formed by way of electroplating, such that the overall structure of the first redistributed conductor 230 is robust and will not damage easily.

Despite the conductive bump 228 of the present embodiment of the disclosure keeps the through hole 218 away from the pad 116 by way of wiring redistribution, the disclosure is not limited thereto. Also, the through hole of the preferred embodiment pass through the pad, and the conductive bump is directly disposed around the through hole on the pad. After that, the conductive bump and the pad of the second substrate are soldered together, so as to constitute the first redistributed conductor having the same structure but at different positions.

The three-dimensional conducting structure of the disclosure can pass through the substrate vertically and extend horizontally so as to achieve three-dimensional wiring within a package structure where several elements need to be interconnected. The conducting structure of the disclosure reduces package volume and shortens wire path. Besides, the first redistributed conductor has a projecting portion and a receiving portion constitute. As the first redistributed conductor is formed in the specific shape disclosed above, electrical current will not leak even when hole enlargement occurs during the process of laser drilling. According to the method for fabricating a three-dimensional conducting structure of the disclosure, the substrate is drilled from the active surface such that the problem of mal-alignment is resolved. Also, a metallic layer is formed to protect the surface of the substrate from being damaged during the process of laser drilling While the disclosure has been described by way of example and in terms of a preferred embodiment, it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A three-dimensional conducting structure applied to a package, comprising:
    a substrate having an active surface, a passive surface opposite to the active one, a pad on the active surface, and a through hole;
    a first redistributed conductor, comprising:
    a projecting portion projected from the active surface of the substrate and electrically connected to the pad; and
    a receiving portion being outside the active surface and in contact with the projecting portion, wherein the projecting portion and the receiving portion constitute a recess, and the recess communicates with the through hole;
    a second redistributed conductor positioned within the through hole and the recess, being in contact with the receiving portion, and extended toward the passive surface along the through hole; and
    an insulator filled between the second redistributed conductor and the substrate and between the second redistributed conductor and the projecting portion.

2. The structure according to claim 1, wherein the through hole passes through the pad.

3. The structure according to claim 2, wherein the projecting portion is positioned on the pad.

4. The structure according to claim 1, wherein the through hole is apart from the pad.

5. The structure according to claim 4, wherein the projecting portion is positioned on the pad and extended to the active surface around the through hole.

6. The structure according to claim 1, wherein the projecting portion is a conductive bump.

7. The structure according to claim 1, wherein the projecting portion and the receiving portion are integrally formed in one piece.

8. The structure according to claim 1, wherein the substrate is a first substrate, and the package further comprises a second substrate adjacent to the active surface of the first substrate and substantially parallel to the first substrate.

9. The structure according to claim 8, wherein the first redistributed conductor further comprises a pad positioned on the second substrate and connected to the receiving portion.

10. The structure according to claim 8, wherein the receiving portion contacts with the second substrate.

11. The structure according to claim 8, wherein the first substrate is a CMOS image sensor (CIS) chip, and the second substrate is a transparent substrate.

12. The structure according to claim 8, wherein the package further comprises a third substrate positioned on the passive surface of the first substrate.

13. The structure according to claim 12, wherein the third substrate comprises a pad being apart from the passive surface of the first substrate.

14. The structure according to claim 12, wherein the pad of the third substrate is electrically connected with the pad of the second substrate through the first redistributed conductor and the second redistributed conductor.

15. The structure according to claim 12, wherein the third substrate is a digital signal processor (DSP).

16. The structure according to claim 8, wherein the package further comprises:
    an insulating layer covering the first substrate and the third substrate; and
    a solder ball positioned under the insulating layer and in contact with the second redistributed conductor.

* * * * *